(12) United States Patent
Frazier

(10) Patent No.: US 6,614,373 B1
(45) Date of Patent: Sep. 2, 2003

(54) METHOD AND SYSTEM FOR SAMPLING A SIGNAL USING ANALOG-TO-DIGITAL CONVERTERS

(75) Inventor: Gary A. Frazier, Garland, TX (US)

(73) Assignee: Raytheon Company, Lexington, MA (US)

(*) Notice: Subject to any disclaimer, the term of this patent is extended or adjusted under 35 U.S.C. 154(b) by 0 days.

(21) Appl. No.: 09/727,310

(22) Filed: Nov. 29, 2000

(51) Int. Cl.$^7$ .................................................. H03M 3/00
(52) U.S. Cl. ......................................... 341/143; 341/155
(58) Field of Search ................................. 341/143, 155

(56) References Cited

U.S. PATENT DOCUMENTS

| | | | | |
|---|---|---|---|---|
| 4,268,820 A | * | 5/1981 | Hareyama | 341/168 |
| 4,876,544 A |   | 10/1989 | Kuraishi | 341/166 |
| 4,987,417 A | * | 1/1991 | Buckland | 341/159 |
| 5,073,777 A | * | 12/1991 | Fukuhara et al. | 341/143 |
| 5,245,341 A |   | 9/1993 | Maeder | 341/143 |
| 5,283,583 A | * | 2/1994 | Ichihara | 341/162 |
| 5,363,101 A | * | 11/1994 | Ueki | 341/143 |
| 5,392,039 A |   | 2/1995 | Thurston | 341/143 |
| 5,528,239 A | * | 6/1996 | Swanson et al. | 341/143 |
| 5,550,872 A | * | 8/1996 | Liberti, Jr. et al. | 375/347 |
| 5,579,247 A | * | 11/1996 | Kerth et al. | 341/143 |
| 5,629,700 A | * | 5/1997 | Kumamoto et al. | 341/161 |
| 5,774,008 A |   | 6/1998 | Shou et al. | 327/361 |
| 5,835,044 A | * | 11/1998 | Nishino | 341/143 |
| 5,852,374 A |   | 12/1998 | Frazier | 327/77 |
| 5,898,395 A |   | 4/1999 | Werrbach et al. | 341/118 |
| 5,986,605 A | * | 11/1999 | Priebe et al. | 342/427 |
| 6,014,570 A | * | 1/2000 | Wong et al. | 455/500 |
| 6,087,986 A | * | 7/2000 | Shoki et al. | 342/383 |
| 6,094,173 A | * | 7/2000 | Nylander | 343/742 |
| 6,166,690 A | * | 12/2000 | Lin et al. | 342/383 |
| 6,204,784 B1 | * | 3/2001 | Hatfield | 341/131 |
| 6,275,540 B1 |   | 8/2001 | Barrett, Jr. et al. | 375/316 |

OTHER PUBLICATIONS

Seitzer et al., Electronic Analog–to–Digital Converters, p. 84–85, 1983.

Frerking, Digital Signal Processing in Communication Systems, p. 495–496, 1994.

* cited by examiner

*Primary Examiner*—Jean Bruner Jeanglaude
(74) *Attorney, Agent, or Firm*—Baker Botts L.L.P.

(57) ABSTRACT

A system for sampling an input signal includes a plurality of analog-to-digital converters operable to convert the input signal into digital output signals. At least one of the analog-to-digital converters is also operable to receive a bias voltage different than a bias voltage received by at least one other analog-to-digital converter and to convert the input signal into the digital output signal using the bias voltage. The system also includes a digital accumulator coupled to the analog-to-digital converters. The digital accumulator is operable to receive the digital output signals from the analog-to-digital converters and to generate a net digital output signal comprising a sum of the digital output signals.

17 Claims, 5 Drawing Sheets

METHOD AND SYSTEM FOR SAMPLING A SIGNAL USING ANALOG-TO-DIGITAL CONVERTERS

TECHNICAL FIELD OF THE INVENTION

This invention relates generally to data processing, and more particularly to a method and system for sampling a signal using analog-to-digital converters.

BACKGROUND OF THE INVENTION

Many different types of analog-to-digital converters are known. One type of analog-to-digital converter is a "flash" analog-to-digital converter. Flash converters use a parallel architecture to sample an analog input signal and generate multiple-bit digital outputs. Another type of analog-to-digital converter is the Delta-Sigma ($\Delta\Sigma$) converter. One-bit Delta-Sigma converters generate digital outputs using the analog input signal and feedback from the prior digital output. "High-order" Delta-Sigma converters typically use many filters to generate a digital output, while "low-order" Delta-Sigma converters typically use fewer filters. In this document, the terms "low-order" and "high-order" are used to denote relative orders of the converters, and are not intended to correspond to any particular range of orders. Low-order Delta-Sigma converters are popular because of their simple design and their insensitivity to manufacturing tolerances.

Communication systems often use analog-to-digital converters to sample analog input signals. The analog signals may contain information that will be processed by the communication system. Typically, the analog-to-digital converter receives the analog signal, samples the analog signal at different times, and generates a digital representation of the analog signal at those times. Each digital representation forms a digital output signal that represents the analog input signal. A processor or other computing device in the communication system uses the digital output signal to approximate the analog signal.

Some applications in the communication system do not require a high level of precision in the sampling of the analog signal, while other applications require precision sampling. Lower-order Delta-Sigma converters have typically not been used in applications that require precision sampling for at least two reasons. First, Delta-Sigma converters typically suffer from the formation of "tones" in the digital output signal. Digital and analog noise in the converter may not be completely random, and low-order Delta-Sigma converters generate one digital output using feedback from the prior digital output. Correlations in the noise may lead to the creation of periodic bit patterns in the feedback loop of the Delta-Sigma converter, which leads to the creation of a spike, or tone, in the time-domain Fourier spectrum of the digital output. The formation of tones typically cannot be avoided in low-order Delta-Sigma converters. These spikes appear to the communication system as part of the information communicated over the analog signal. Because of this, lower-order Delta-Sigma converters cannot typically be used in applications that require precision sampling of the input signal.

Lower-order Delta-Sigma converters have also typically not been used in applications that require precision sampling because of their lower signal-to-noise power ratio. The signal-to-noise power ratio represents the power of the useful information generated by a converter compared to the power of the noise or undesired signals generated by the converter. The order of the Delta-Sigma converters typically determines the degree of noise shaping, and thus noise reduction, at frequencies near that of the analog input signal. Lower-order Delta-Sigma converters typically have lower signal-to-noise power ratios than the higher-order converters. As a result, the higher-order converters typically provide greater precision than the lower-order converters.

Approaches to providing precision sampling typically involve using a flash converter or a higher-order Delta-Sigma converter. These types of converters have typically provided greater precision in the sampling of the analog signal. A problem with this approach is that typical flash converters and higher-order Delta-Sigma converters generally include more components than other types of converters. The use of more components increases the cost of the communication system and increases the complexity of manufacturing the converters.

Another problem with this approach is that prior attempts to eliminate tones in the communication system often reduce the effectiveness of the converter or add complexity to the converter. For example, eliminating tones in a higher-order Delta-Sigma converter typically requires the use of multiple feedback paths within the converter, which increases the complexity of the converter.

Tones in flash converters typically result from unavoidable errors that occur in the discretization of a continuous analog input signal into a limited number of possible digital output values. The minimum amplitude of tonal errors is typically set by the number of effective output bits provided by the converter. Eliminating tones in a flash converter typically requires the introduction of noise to the analog input signal. This is often referred to as "dithering" the analog signal. However, dithering reduces the signal-to-noise power ratio, and therefore the effectiveness, of the flash converter.

A further problem with this approach is that a higher-order Delta-Sigma converter may suffer from instability from variations in the manufacturing process. Higher-order Delta-Sigma converters are not as insensitive to manufacturing tolerances as the lower-order converters. As a result, the performance of higher-order converters may be strongly affected by the materials used in their construction and imperfections in the circuitry.

SUMMARY OF THE INVENTION

The present invention recognizes a need for an improved method and system for sampling a signal using analog-to-digital converters. The present invention reduces or eliminates at least some of the shortcomings of prior systems and methods.

In one embodiment of the invention, a system for sampling an input signal includes a plurality of analog-to-digital converters operable to convert the input signal into digital output signals. At least one of the analog-to-digital converters is also operable to receive a bias voltage different than a bias voltage received by at least one other analog-to-digital converter and to convert the input signal into the digital output signal using the bias voltage. The system also includes a digital accumulator coupled to the analog-to-digital converters. The digital accumulator is operable to receive the digital output signals from the analog-to-digital converters and to generate a net digital output signal comprising a sum of the digital output signals.

In one particular embodiment of the invention, the analog-to-digital converters comprise first-order or second-order Delta-Sigma analog-to-digital converters. In another particular embodiment of the invention, all of the analog-to-digital converters are operable to receive different bias voltages, such as between +5 mV and −5 mV. In another embodiment of the invention, a method for sampling an input signal includes receiving the input signal, and converting the input signal into a plurality of digital output signals using a plurality of analog-to-digital converters. At least one of the analog-to-digital converters is operable to receive a bias voltage different than a bias voltage received by at least one other analog-to-digital converter and to convert the input signal into the digital output signal using the bias voltage. The method also includes generating a net digital output signal comprising a sum of the digital output signals.

Numerous technical advantages can be gained through various embodiments of the invention. Various embodiments of the invention may exhibit none, some, or all of the following advantages. For example, in one embodiment of the invention, a system is provided that uses a plurality of analog-to-digital converters to convert an input signal into digital output signals. In one embodiment, the analog-to-digital converters are Delta-Sigma converters, such as first-order or second-order converters. The lower-order Delta-Sigma converters typically include fewer components than converters previously used in other systems. This helps to reduce the cost of the communication system and the complexity of manufacturing the converters. Also, lower-order Delta-Sigma converters are typically more stable than other types of converters, and they are more insensitive to manufacturing tolerances. This also helps to reduce the complexity of manufacturing the converters.

Another technical advantage of some embodiments of the invention is that the presence of tones may be reduced or eliminated in the communication system. In one embodiment, the analog-to-digital converters use direct current (DC) bias voltages to generate the digital output signals. In a particular embodiment, each converter receives a different bias voltage, such as between +5 mV and −5 mV. Biasing an analog-to-digital converter with a bias voltage may change the frequency at which tones are generated by that converter. In other words, the tones generated by one converter receiving a particular bias voltage may appear at higher or lower frequencies compared to the tones generated by another converter receiving a different bias voltage. By biasing multiple analog-to-digital converters with different bias voltages, the converters may generate tones that have different frequencies. Some of the converters may produce tones at the same frequency, but other converters produce tones at different frequencies.

Because a smaller percentage of the converters produce tones at the same frequency, a sum of the digital output signals produced by the converters may have fewer tones. For example, if the system includes one thousand analog-to-digital converters, one hundred of the converters may produce a tone at 500 MHz. However, nine hundred of the converters may not produce a tone at 500 MHz. Because only one tenth of the converters generate a tone at 500 MHz, the net power spectral density of the 500 MHz tone from all converters may fall below the net level of noise at 500 MHz from all converters. This helps to reduce or eliminate the tones produced in the communication system. This also helps to improve the signal-to-noise power ratio of the converters because less noise or undesired signals are being produced in the system.

A further advantage is that some embodiments of the invention may reduce or eliminate tones in the net digital output signal without reducing the effectiveness of or adding complexity to the converters. For example, some embodiments of the invention may reduce or eliminate tones in the net digital output signal without requiring the use of multiple feedback paths within the converters. Also, some embodiments of the invention do not require the introduction of noise to the input signal, which helps to prevent the decrease in the signal-to-noise power ratio associated with dithering the input signal.

Other technical advantages are readily apparent to one of skill in the art from the attached figures, description, and claims.

BRIEF DESCRIPTION OF THE DRAWINGS

For a more complete understanding of the present invention and the advantages thereof, reference is now made to the following descriptions taken in connection with the accompanying drawings, in which.

DETAILED DESCRIPTION OF THE INVENTION

Figure 1:
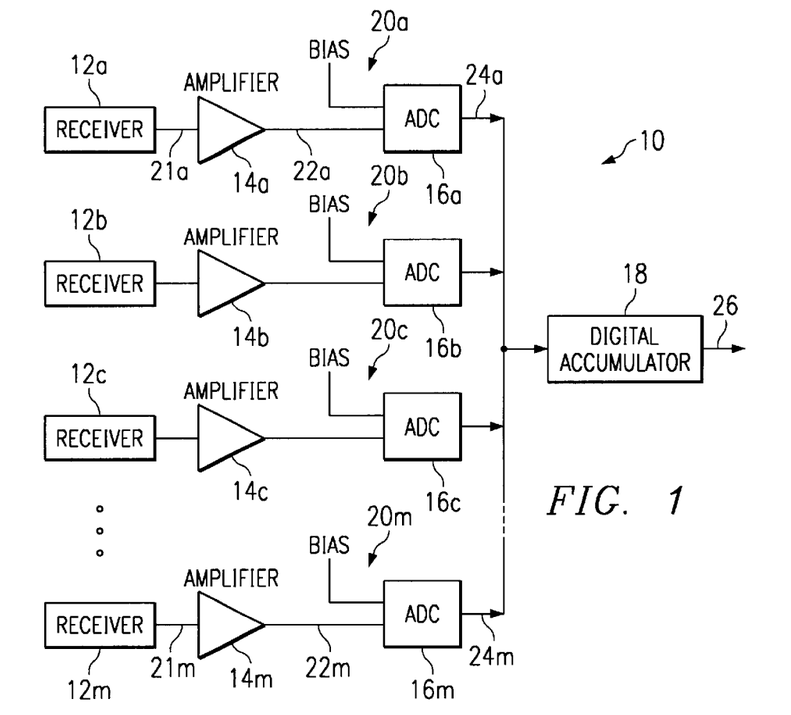
FIG. 1 is a block diagram illustrating an exemplary communication system constructed according to the teachings of the present invention.

FIG. 1 is a block diagram illustrating an exemplary communication system 10 constructed according to the teachings of the present invention. In the illustrated embodiment, system 10 includes a plurality of receivers 12a–12m, a plurality of amplifiers 14a–14m, a plurality of analog-to-digital converters (ADCs) 16a–16m, and a digital accumulator 18. Other embodiments of system 10 may be used without departing from the scope of the present invention.

In one aspect of operation, analog-to-digital converters 16 receive and quantize an input signal 22, generating digital output signals 24. Digital accumulator 18 receives the digital output signals 24 from analog-to-digital converters 16 and sums the digital output signals 24, generating a net digital output signal 26. At least one of the analog-to-digital converters 16 may also be biased with a bias voltage 20. In a particular embodiment, each analog-to-digital converter 16 is biased with a different bias voltage 20, such as between +5 mV and −5 mV. Bias voltage 20 changes the frequency at which tones are generated by analog-to-digital converter 16. As a result, the tones generated by analog-to-digital converters 16 may occur at different frequencies depending on bias voltage 20. By using bias voltages 20a–20m to spread the tones over different frequencies, the net digital output signal 26 generated by digital accumulator 18 may contain fewer tones.

In the illustrated embodiment, each receiver 12 is coupled to an amplifier 14. In this document, the term "couple" refers to any direct or indirect communication between two or more elements, whether or not those elements are in physical contact with one another. Receiver 12 is operable to receive an input signal 21, such as an analog signal, and to communicate the input signal 21 to amplifier 14. Receiver 12 may receive the input signal 21 over any suitable communication medium, such as a wireless or a wireline medium. Receiver 12 may comprise any hardware, software, firmware, or combination thereof operable to receive input signals 21. In one embodiment, receiver 12 comprises a receiver element in an antenna, such as a phased array antenna.

Each amplifier 14 is coupled to a receiver 12 and an analog-to-digital converter 16. Amplifier 14 is operable to receive the input signal 21 from receiver 12 and to amplify the signal 21. Amplifier 14 is also operable to communicate the amplified signal 22 to analog-to-digital converter 16. Amplifier 14 may comprise any hardware, software, firmware, or combination thereof operable to amplify input signals 21. In one embodiment, amplifier 14 comprises a low noise amplifier operable to amplify input signals 21 without adding excessive noise to the amplified signal 22. In another embodiment, system 10 may process input signals 21 without amplifying the signals 21.

Figure 2:
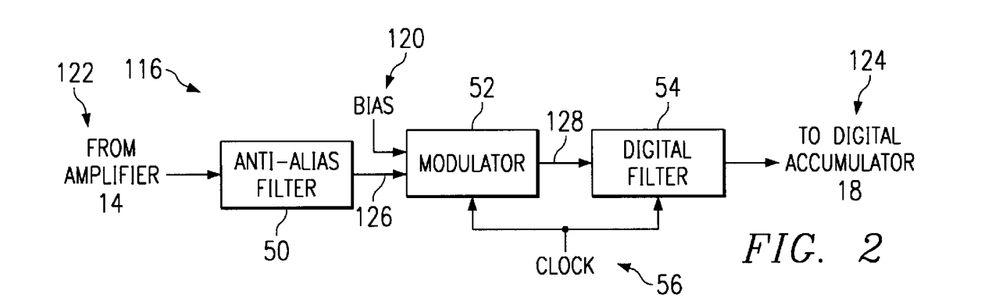
FIG. 2 is a block diagram illustrating an exemplary analog-to-digital converter constructed according to the teachings of the present invention.

Each analog-to-digital converter 16 is coupled to an amplifier 14 and to digital accumulator 18. Analog-to-digital converter 16 is operable to receive the input signal 22 from amplifier 14. Analog-to-digital converter 16 is also operable to convert the input signal 22 into a digital output signal 24 that contains digital values representing the input signal 22. Analog-to-digital converter 16 is further operable to communicate the digital output signal 24 to digital accumulator 18. Analog-to-digital converter 16 may comprise any hardware, software, firmware, or combination thereof operable to convert input signals into digital signals 24. In one embodiment, analog-to-digital converter 16 comprises a Delta-Sigma analog-to-digital converter. In a particular embodiment, analog-to-digital converter 16 comprises a first-order or second-order Delta-Sigma converter. One embodiment of analog-to-digital converter 16 is shown in FIG. 2, which is described below.

Digital accumulator 18 is coupled to analog-to-digital converters 16. Digital accumulator 18 receives the digital output signals 24 representing the input signals 22 from analog-to-digital converters 16. Digital accumulator 18 also sums the digital output signals 24 generated by analog-to-digital converters 16, generating a net digital output signal 26. Digital accumulator 18 may comprise any hardware, software, firmware, or combination thereof operable to sum digital signals 24. In one embodiment, digital accumulator 18 comprises a digital signal processor operable to sum the digital signals 24 from analog-to-digital converters 16. In a particular embodiment, digital accumulator 18 comprises a binary adder tree operable to sum a plurality of output signals 24 and generate a multiple-bit net output signal 26.

In typical operation, low-order Delta-Sigma analog-to-digital converters 16 may suffer from the formation of tones in the digital output signals 24. These tones are caused by periodic bit patterns in a feedback loop within the Delta-Sigma converter, which leads to the creation of a spike in the time-domain Fourier spectrum of the digital output signal 24. The formation of tones typically cannot be avoided in low-order Delta-Sigma analog-to-digital converters 16.

In one embodiment of the invention, the collective effect of multiple tones generated by multiple analog-to-digital converters 16 may be reduced or eliminated in net digital output signal 26 by biasing at least one analog-to-digital converter 16 with a bias voltage 20. Analog-to-digital converter 16 uses bias voltage 20 in converting the input signal 22 into a digital output signal 24. Biasing analog-to-digital converter 16 with bias voltage 20 may not prevent the formation of tones in the digital output signal 24 of that converter 16, but it may "push" the tones to a higher or lower frequency. By applying different bias voltages 20a–20m to various converters 16, and thereby changing the frequencies at which the tones are generated, the tones may be spread out across a wider range of frequencies. This may prevent the tones from forming at the same frequency in each analog-to-digital converter 16. Because the tones are spread across a wider range of frequencies, the effects of the tones may be reduced or eliminated when digital accumulator 18 sums the digital output signals 24 of analog-to-digital converters 16.

In one embodiment, at least one analog-to-digital converter 16 is biased with a bias voltage 20. In another embodiment, all analog-to-digital converters 16 are biased with different bias voltages 20a–20m. In a particular embodiment, analog-to-digital converters 16 may be biased with bias voltages 20a–20m of between +5 mV and −5 mV.

FIG. 2 is a block diagram illustrating an exemplary analog-to-digital converter 116 constructed according to the teachings of the present invention. Analog-to-digital converter 116 may be suitable for use in system 10 of FIG. 1. In the illustrated embodiment, analog-to-digital converter 116 includes an anti-alias filter 50, a modulator 52, and a digital filter 54. Other embodiments of analog-to-digital converter 116 may be used without departing from the scope of the present invention.

Anti-alias filter 50 is coupled to modulator 52. Anti-alias filter 50 receives the amplified input signal 122 from amplifier 14. Anti-alias filter 50 is also operable to filter or "band limit" the input signal 122, which limits the frequencies of the input signal 122 that may be sampled by modulator 52. Anti-alias filter 50 is further operable to provide the filtered input signal 126 to modulator 52. Anti-alias filter 50 may comprise any hardware, software, firmware, or combination thereof operable to filter the input signal 122. Anti-alias filter 50 may, for example, comprise a low-pass filter, a band-pass filter, or a high-pass filter.

Figure 3:
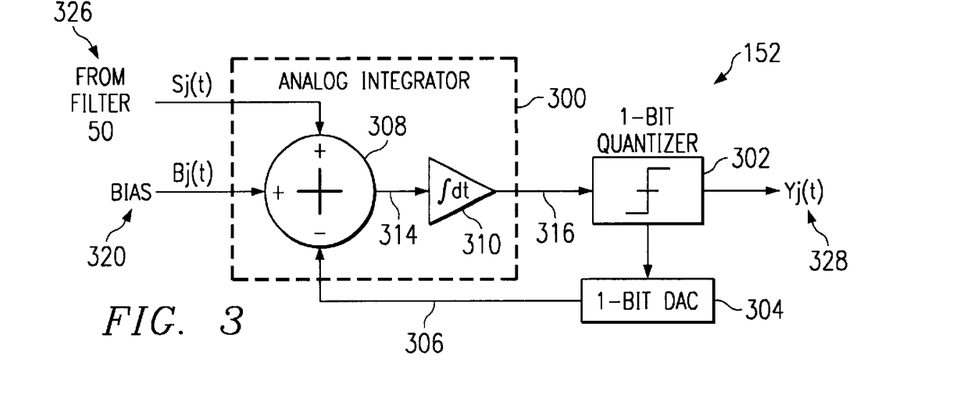
FIG. 3 is a block diagram illustrating an exemplary modulator constructed according to the teachings of the present invention.
Figure 4:
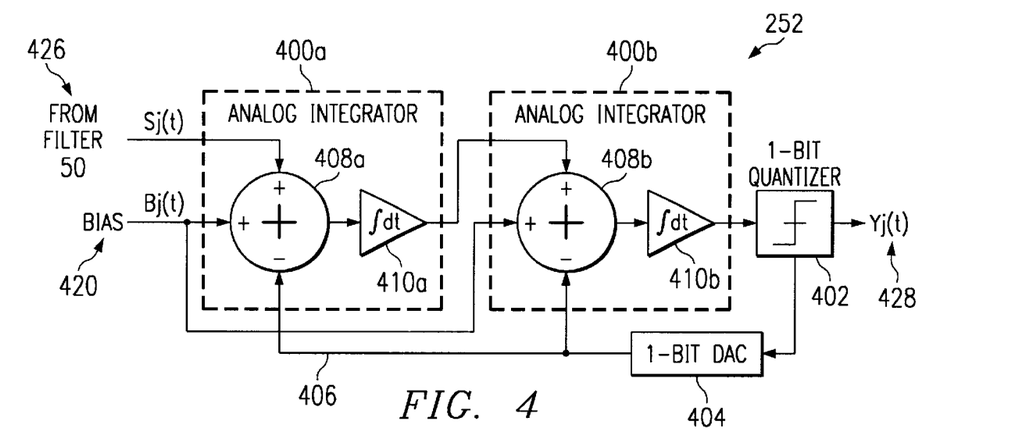
FIG. 4 is a block diagram illustrating another exemplary modulator constructed according to the teachings of the present invention.

Modulator 52 is coupled to anti-alias filter 50 and digital filter 54. Modulator 52 is operable to receive the filtered input signal 126 from anti-alias filter 50. Modulator 52 is also operable to sample the input signal 126 and to generate a digital signal 128 containing digital representations of the input signal 126. In addition, modulator 52 communicates the digital signal 128 to digital filter 54. Modulator 52 may sample the input signal 126 according to a clock signal 56. Modulator 52 may comprise any hardware, software, firmware, or combination thereof operable to receive and quantize an input signal 126. Example embodiments of various modulators are shown in FIGS. 3 and 4, which are described below.

In one embodiment, modulator 52 also receives a bias voltage 120, and modulator 52 uses bias voltage 120 in generating digital signal 128. Bias voltage 120 facilitates the reduction or elimination of tones in system 10 by altering the frequency at which the tones are produced by modulator 52. In a particular embodiment, bias voltage 120 comprises a voltage of between +5 mV and −5 mV.

Digital filter 54 is coupled to modulator 52 and to digital accumulator 18. Digital filter 54 is operable to receive the digital signal 128 from modulator 52. Digital filter 54 is also operable to filter the digital signal 128 received from modulator 52. Digital filter 54 may, for example, receive a plurality of digital values from modulator 52 in a given time period, where the values represent the input signal 126 during a plurality of samples. Digital filter 54 may also determine an average of the digital values received from modulator 52 during the time period. This may include, for example, digital filter 54 determining whether more high digital values or more low digital values were received from modulator 52. If more high digital values are received, digital filter 54 outputs a high value to digital accumulator 18 in digital output signal 124. If more low digital values are received, digital filter 54 outputs a low value to digital accumulator 18 in digital output signal 124. Digital filter 54 may filter digital values received from modulator 52 under the control of clock 56. Digital filter 54 may comprise any hardware, software, firmware, or combination thereof operable to filter digital signals 128 from modulator 52. Digital filter 54 may, for example, comprise an up/down counter, where each high digital value from modulator 52 increments the counter and each low digital value decrements the counter.

In one aspect of operation, bias voltage 120 alters the frequency at which tones produced by modulator 52 appear. Although the use of bias voltage 120 may not reduce or eliminate the formation of tones generated by one modulator 52, bias voltage 120 may change the frequency at which the tones are produced by modulator 52. By changing the frequency at which the tones are produced by modulator 52, the tones generated by multiple modulators 52 can be spread over a wider frequency range. This may allow digital accumulator 18 to remove the tones in the net digital output signal 26. In a particular embodiment, modulators 52 receive different bias voltages 120a–120m, and the tones produced by each modulator 52 occur at different frequencies. The different frequencies of the tones allow digital accumulator 18 to remove the tones when summing the digital output signals 124 of analog-to-digital converters 116.

FIG. 3 is a block diagram illustrating an exemplary modulator 152 constructed according to the teachings of the present invention. Modulator 152 may be suitable for use in analog-to-digital converter 116 of FIG. 2. In the illustrated embodiment, modulator 152 comprises a first order Delta-Sigma modulator that includes an analog integrator 300, a one-bit quantizer 302, and a one-bit digital-to-analog converter (DAC) 304. Other embodiments of modulator 152 may be used without departing from the scope of the present invention.

In the illustrated embodiment, analog integrator 300 includes a summer 308 and an integrator 310. Summer 308 is operable to receive all or a portion of the filtered input signal $S_j(t)$ 326 from filter 50, a bias voltage $B_j(t)$ 320, and a feedback value 306 from digital-to-analog converter 304. Summer 308 is also operable to combine the signals by adding the input signal 326 and bias voltage 320 and subtracting the feedback value 306. The resulting signal 314 represents an incremental change in the input signal 326 from the previous digital value produced by quantizer 302. Summer 308 then communicates the resulting signal 314 to integrator 310. Summer 308 may comprise any hardware, software, firmware, or combination thereof operable to combine input values. In one embodiment, summer 308 comprises one or more differential amplifiers.

Integrator 310 is coupled to summer 308 and quantizer 302. Integrator 310 is operable to receive a plurality of signals 314 generated by summer 308. These signals 314 represent the incremental changes in the input signal 326 from the previous digital value produced by quantizer 302 during a plurality of samples. Integrator 310 sums the incremental changes received from summer 308 and generates an output signal 316. Signal 316 represents the overall change in the input signal 326 during the samples. Integrator 310 may comprise any hardware, software, firmware, or combination thereof operable to generate output values 316 representing changes in the input signal 326. In one embodiment, integrator 310 comprises an integration amplifier.

Quantizer 302 is coupled to integrator 310 and digital-to-analog converter 304. Quantizer 302 is operable to receive the output signal 316 generated by integrator 310, where the signal 316 represents an overall change in the input signal 326. Quantizer 302 is also operable to compare the output 316 from integrator 310 to a reference signal and to generate a digital output $Y_j(t)$ 328 based on the comparison. For example, when the output 316 of integrator 310 is higher than the reference signal, quantizer 302 may generate a high output signal. When the output 316 of integrator 310 is lower than the reference signal, quantizer 302 may generate a low output signal. Quantizer 302 may communicate the output signal 328 to digital filter 54 and/or digital-to-analog converter 304. Quantizer 302 may comprise any hardware, software, firmware, or combination thereof operable to compare the signal 316 from integrator 310 to a reference signal. In one embodiment, quantizer 302 comprises a comparator with one input coupled to the output 316 of integrator 310 and a second input coupled to ground.

Digital-to-analog converter 304 is coupled to quantizer 302 and summer 308. Digital-to-analog converter 304 is operable to receive the digital signal 328 generated by quantizer 302. Digital-to-analog converter 304 is also operable to convert the digital signal 328 into an analog signal 306. Digital-to-analog converter 304 communicates the analog signal 306 to summer 308 as the feedback value. Digital-to-analog converter 304 may comprise any hardware, software, firmware, or combination thereof operable to convert digital signals 328 to analog signals 306. In one embodiment, digital-to-analog converter 304 comprises a resistor operable to receive the output signal 328 produced by quantizer 302 and to convert the voltage of the signal 328 to a current suitable for use by analog integrator 300.

FIG. 4 is a block diagram illustrating another exemplary modulator 252 constructed according to the teachings of the present invention. Modulator 252 may be suitable for use in analog-to-digital converter 116 of FIG. 2. In the illustrated embodiment, modulator 252 comprises a second-order Delta-Sigma modulator that includes two analog integrators 400a and 400b, a one-bit quantizer 402, and a one-bit digital-to-analog converter 404. Other embodiments of modulator 252 may be used without departing from the scope of the present invention.

In the illustrated embodiment, each analog integrator 400 includes a summer 408 and an integrator 410. Summer 408 and integrator 410 may be the same or similar to summer 308 and integrator 310, respectively, of FIG. 3. Also, quantizer 402 and digital-to-analog converter 404 may be the same or similar to quantizer 302 and digital-to-analog converter 304, respectively, of FIG. 3.

The use of a second-order Delta-Sigma modulator in analog-to-digital converter 116 may reduce the amount of noise produced by analog-to-digital converter 116. Second order Delta-Sigma modulators use two analog integrators 400 to filter the input signal 426, which may allow less noise to be generated in the digital output signal 428 than with first-order Delta-Sigma modulators.

In the illustrated embodiment, bias voltage 420 is shown as being provided to both summers 408a and 408b. In another embodiment, bias voltage 420 may be applied to either summer 408a or summer 408b.

Figure 5:
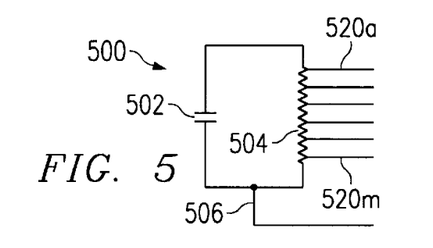
FIG. 5 is a block diagram illustrating an exemplary voltage divider constructed according to the teachings of the present invention.

FIG. 5 is a block diagram illustrating an exemplary voltage divider 500 constructed according to the teachings of the present invention. Voltage divider 500 may be suitable for use in system 10 of FIG. 1. In the illustrated embodiment, voltage divider 500 includes a power supply 502 and a resistive element 504. Other embodiments of voltage divider 500 may be used without departing from the scope of the present invention. For example, more than one voltage divider 500 may be used in system 10 to generate bias voltages 520a–520m.

Power supply 502 is coupled to resistive element 504. Power supply 502 acts as a voltage source used to produce bias voltages 520. Power supply 502 may comprise any suitable power supply, such as a direct current battery.

Resistive element 504 is coupled to power supply 502. Resistive element 504 receives the voltage supplied by power supply 502 and divides the voltage into one or more bias voltages 520. For example, resistive element 504 may divide the voltage from power supply 502 such that bias voltage 520a is larger than bias voltage 520m. In this embodiment, the bias voltages 520a–520m may be measured from a common electrical point 506. Bias voltages 520a–520m may, for example, be provided to modulators 52a–52m in system 10 as biases 120a–120m. Common electrical point 506 may be coupled to modulators 52, such as to the ground point of modulators 52. Resistive element 504 may comprise any suitable resistive element or elements operable to divide the voltage supplied by power supply 502. In one embodiment, resistive element 504 comprises a plurality of resistors coupled in series.

Although FIG. 5 illustrates each bias voltage 520 being produced at different points in resistive element 504, the same bias voltage 520 may be provided to multiple analog-to-digital converters 16 in system 10. Also, in one embodiment, the input signal 22 may also be passed through voltage divider 500. This may allow, for example, biasing of the input signal 22 before the signal is passed to analog-to-digital converter 16. In this embodiment, each analog-to-digital converter 16 receives a portion of the input signal 22.

Figure 6A:
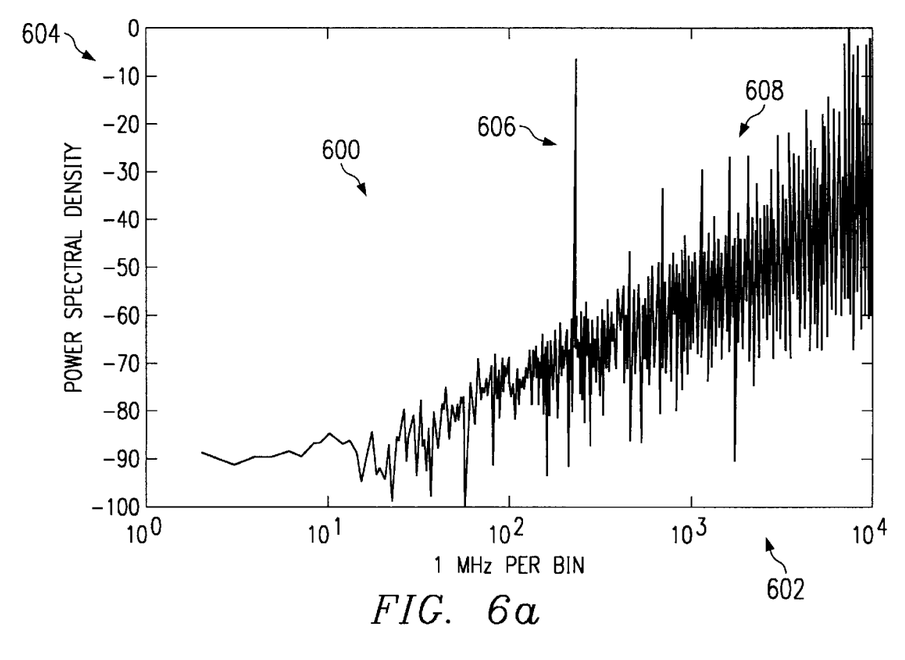
FIGS. 6a and 6b are spectral diagrams illustrating digital output signals of unbiased analog-to-digital converters.
Figure 6B:
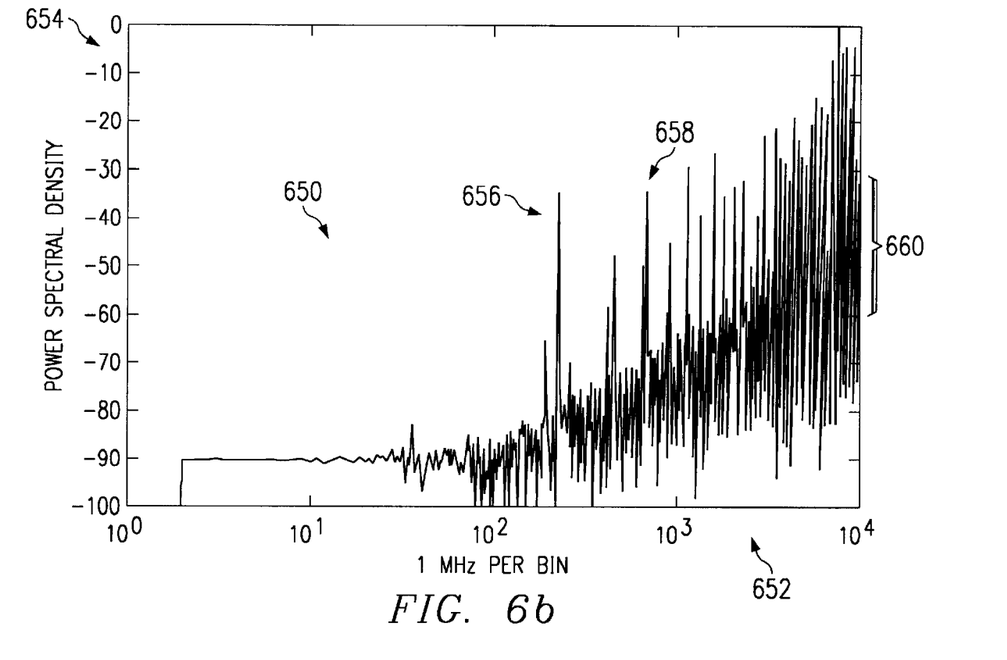

FIGS. 6a and 6b are spectral diagrams illustrating digital output signals of unbiased analog-to-digital converters 16. FIG. 6a is a spectral diagram illustrating a digital output signal 600 of one unbiased analog-to-digital converter 16. FIG. 6b is a spectral diagram illustrating a net digital output signal 650 of one hundred unbiased analog-to-digital converters 16. The spectral diagrams in FIGS. 6a and 6b are for illustration only.

FIG. 6a illustrates how the power spectral density 604 of the digital output signal 600 generated by one unbiased analog-to-digital converter 16 varies by frequency 602. The input signal 22 received by analog-to-digital converter 16 comprises a 223 MHz signal, although the input signal 22 could carry information at any other frequency. The information in the input signal 22 is also contained in the digital output signal 600 as a digitized value 606. As shown in FIG. 6a, the digital output signal 600 generated by one unbiased analog-to-digital converter 16 contains tones 608, which appear as spikes in the digital output signal 600.

FIG. 6b illustrates how the power spectral density 654 of the net digital output signal 650 of one hundred unbiased analog-to-digital converters 16 varies by frequency 652. The information in the input signal 22 is still contained in the digital output signal 650 as a digitized value 656.

The signal-to-noise power ratio of signal 650 has also improved by approximately 20 decibels, shown in FIG. 6b as drop 660. Summing the digital signals 24 produced by multiple analog-to-digital converters 16 typically improves the signal-to-noise power ratio of the net digital output signal 650 by 10*log(N) decibels, where N equals the number of analog-to-digital converters 16. The use of one hundred analog-to-digital converters 16 typically generates an improved signal-to-noise power ratio of 10*log(100), or 20, decibels. However, as shown in FIG. 6b, the net digital output signal 650 of one hundred unbiased analog-to-digital converters 16 still contains tones 658. Summing the digital output signals 24 generated by analog-to-digital converters 16 has not reduced or eliminated the presence of tones 658 in the net digital output signal 650.

Figure 7A:
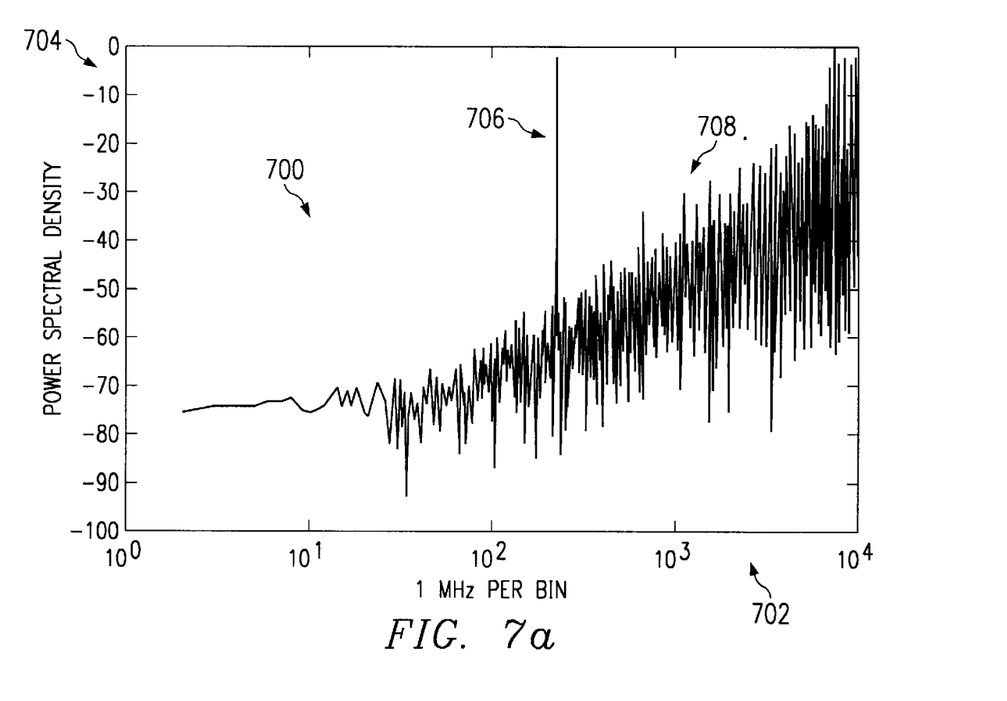
FIGS. 7a and 7b are spectral diagrams illustrating digital output signals of biased analog-to-digital converters.
Figure 7B:
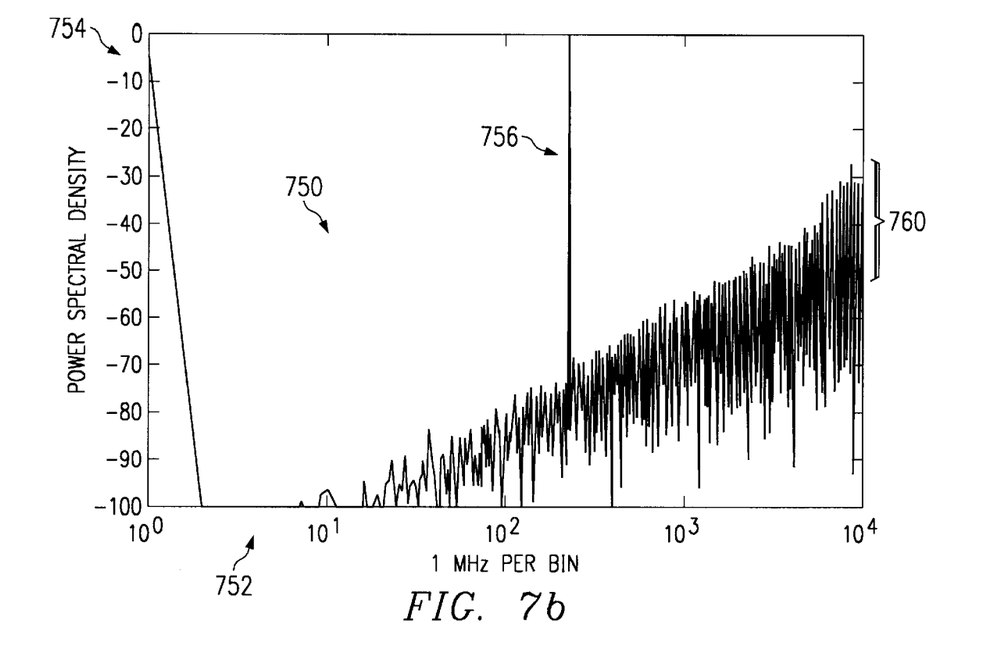

FIGS. 7a and 7b are spectral diagrams illustrating digital output signals of biased analog-to-digital converters 16. FIG. 7a is a spectral diagram illustrating a digital output signal 700 of one biased analog-to-digital converter 16. FIG. 7b is a spectral diagram illustrating a net digital output signal 750 of one hundred biased analog-to-digital converters 16. The spectral diagrams in FIGS. 7a and 7b are for illustration only.

FIG. 7a illustrates how the power spectral density 704 of the digital output signal 700 generated by one biased analog-to-digital converter 16 varies by frequency 702. Signal 700 is produced by an analog-to-digital converter 16 receiving a bias voltage 20 of +2 mV. The input signal 22 received by analog-to-digital converter 16 comprises a 223 MHz signal, which is contained in the digital output signal 700 as a digitized value 706. As shown in FIG. 7a, the digital output signal 700 generated by one biased analog-to-digital converter 16 still contains tones 708. The biasing of analog-to-digital converter 16 has changed the frequency at which the tones 708 are generated, but the tones 708 are still present in signal 700.

FIG. 7b illustrates how the power spectral density 754 of the net digital output signal 750 of one hundred biased analog-to-digital converters 16 varies by frequency 752. Analog-to-digital converters 16 generating digital signals 24 are biased with various bias voltages 20a–20m between +5 mV and −5 mV. The information contained in the input signal 22 is still contained in the digital output signal 750 as a digitized value 756. Also, the overall signal-to-noise power ratio of signal 750 has improved by approximately 20 decibels, shown in FIG. 7b as drop 760.

In addition, as shown in FIG. 7b, the net digital output signal 750 of one hundred biased analog-to-digital converters 16 contains few or no tones. By biasing analog-to-digital converters 16 with various bias voltages 20a–20m, analog-to-digital converters 16 generate tones at different frequencies. Because the tones are at different frequencies, summing the digital signals 24 generated by analog-to-digital converters 16 reduces or eliminates the tones from digital output signal 750. While the overall signal-to-noise power ratio of signal 750 has improved by approximately 20 decibels, the high-frequency tones in signal 750 have been reduced by 30 decibels. The biasing of analog-to-digital converters 16 has reduced the tones in signal 750 to a greater extent, which improves the performance of analog-to-digital converters 16.

This improved performance of analog-to-digital converters 16 may allow for the construction of communication systems having greater sensitivity. For example, analog-to-digital converters 16 may be designed to sample, at a rate of 10 GHz, a signal having a 1 GHz bandwidth centered at 4 GHz. In an antenna, such as a phased array antenna, with 10,000 analog-to-digital converters 16, the signal-to-noise power ratio of the net digital output signal 26 would improve by 10*log(10,000), or 40, decibels. Also, by biasing the analog-to-digital converters 16 with bias voltages 20, tones in the net digital output signal 26 may also be reduced, for example, by 24 decibels. This provides for a signal-to-noise power ratio of 64 decibels across the 1 GHz bandwidth. This provides for a more sensitive, and therefore more effective, communication system.

Figure 8:
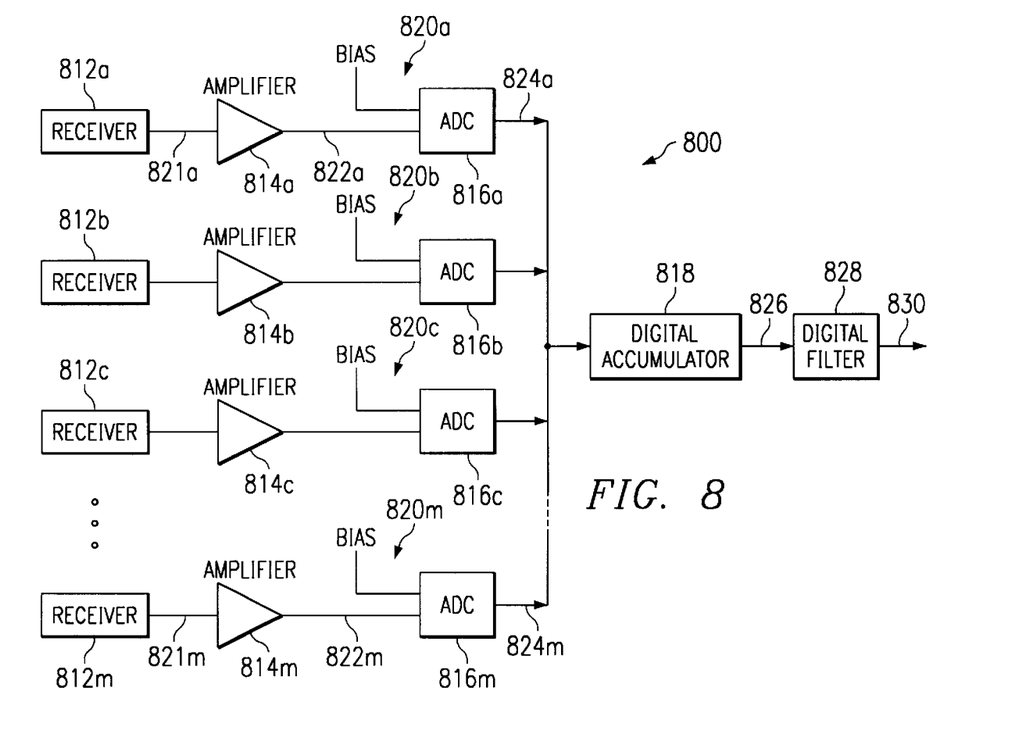
FIG. 8 is a block diagram illustrating another exemplary communication system constructed according to the teachings of the present invention.

FIG. 8 is a block diagram illustrating another exemplary communication system 800 constructed according to the teachings of the present invention. In the illustrated embodiment, system 800 includes a plurality of receivers 812a–812m, a plurality of amplifiers 814a–814m, a plurality of analog-to-digital converters (ADCs) 816a–816m, a digital accumulator 818, and a digital filter 828. Other embodiments of system 800 may be used without departing from the scope of the present invention.

Receiver 812, amplifier 814, and digital accumulator 818 may be the same or similar to receiver 12, amplifier 14, and digital accumulator 18, respectively, of FIG. 1. Also, one embodiment of analog-to-digital converter 816 is shown in FIG. 9, which is described below.

Digital filter 828 is coupled to digital accumulator 818. Digital filter 828 is operable to filter the net digital output signal 826 received from accumulator 818 and to produce a filtered net digital output signal 830. Digital filter 828 may, for example, receive a plurality of digital values from accumulator 818 in a given time period, where each digital value represents a sum of signals 824 produced by analog-to-digital converters 816. In one embodiment, digital filter 828 may also determine an average of the digital values received from accumulator 818 during the time period. Digital filter 828 may comprise any hardware, software, firmware, or combination thereof operable to filter digital signals 826 from accumulator 818.

Figure 9:
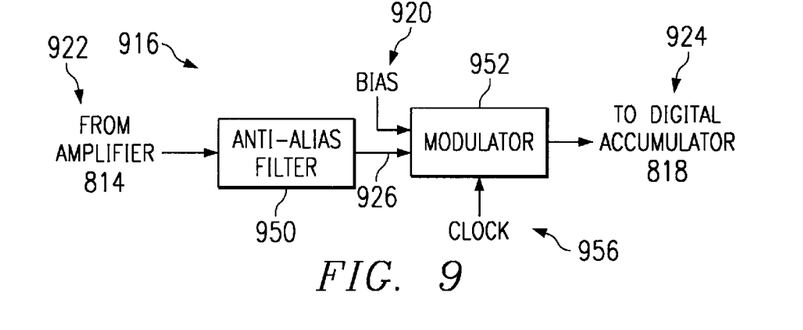
FIG. 9 is a block diagram illustrating another exemplary analog-to-digital converter constructed according to the teachings of the present invention.

FIG. 9 is a block diagram illustrating another exemplary analog-to-digital converter 916 constructed according to the teachings of the present invention. Analog-to-digital converter 916 may be suitable for use in system 800 of FIG. 8. In the illustrated embodiment, analog-to-digital converter 916 includes an anti-alias filter 950 and a modulator 952. Other embodiments of analog-to-digital converter 916 may be used without departing from the scope of the present invention.

Anti-alias filter 950 and modulator 952 may be the same or similar to anti-alias filter 50 and modulator 52, respectively, of FIG. 2. Modulator 952 produces a digital output signal 924, which is communicated to digital accumulator 818. In this embodiment, digital output signal 924 may contain unfiltered data, which is summed by accumulator 818 and filtered by digital filter 828.

Figure 10:
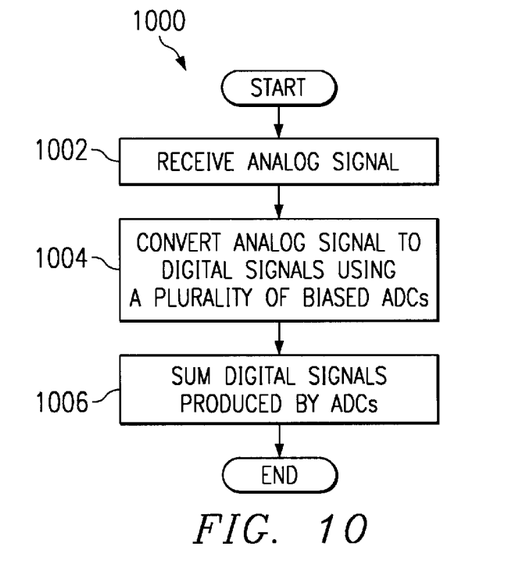
FIG. 10 is a flowchart illustrating an exemplary method for sampling an input signal according to the teachings of the present invention.

FIG. 10 is a flowchart illustrating an exemplary method 1000 for sampling an input signal according to the teachings of the present invention. Although method 1000 is described as it relates to system 10, the same or similar method may be used in system 800.

System 10 receives an input signal at step 1002. This may include, for example, receiving input signal 21 over a wireless or wireline interface. In one embodiment, this may also include amplifying the input signal 21. System 10 converts the input signal 21 to a plurality of digital signals 24 using analog-to-digital converters 16 at step 1004. This may include, for example, analog-to-digital converters 16 receiving and sampling the input signal 21. This may also include one or more analog-to-digital converters 16 receiving a bias voltage 20 and using bias voltage 20 to generate the digital signals 24. In one embodiment, analog-to-digital converters 16 receive different bias voltages 20 of between +5 mV and −5 mV.

System 10 sums the digital signals 24 generated by analog-to-digital converters 16 at step 1006. This may include, for example, digital accumulator 18 receiving the digital signals 24 produced by analog-to-digital converters 16. This may also include digital accumulator 18 summing the digital signals 24 produced by analog-to-digital converters 16 and generating a net digital output signal 26.

Figure 11:
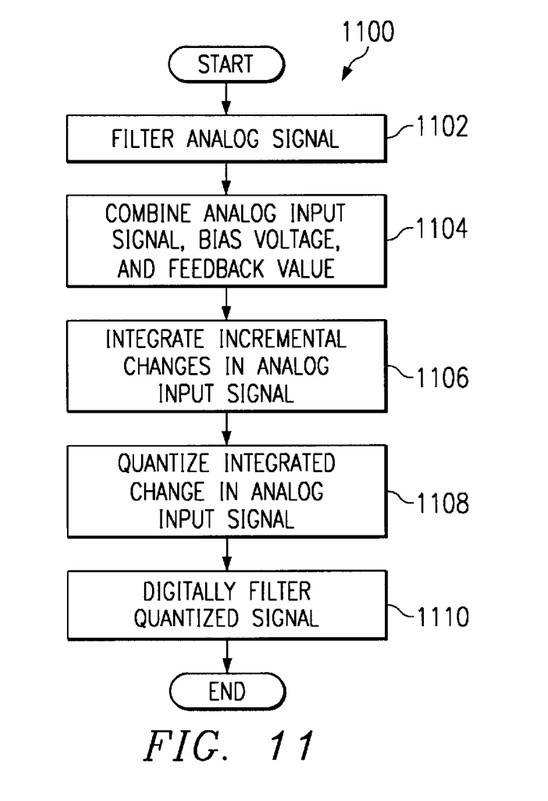
FIG. 11 is a flowchart illustrating an exemplary method for converting an input signal to a digital signal according to the teachings of the present invention.

FIG. 11 is a flowchart illustrating an exemplary method 1100 for converting an input signal to a digital signal according to the teachings of the present invention. Method 1100 may be used by one or more analog-to-digital converters 116 to generate a digital signal 124 containing digital representations of the input signal 122. Although method 1100 is described as it relates to analog-to-digital converter 116, a similar method may be used with respect to analog-to-digital converter 916.

System 10 filters the input signal at step 1102. This may include, for example, anti-alias filter 50 band limiting the frequency of input signal 122. System 10 combines the filtered input signal, a bias voltage, and a feedback value at step 1104. This may include, for example, summer 308 in modulator 152 combining filtered signal 326 and bias voltage 320 and subtracting feedback value 306. This may also include digital-to-analog converter 304 in modulator 152 converting the prior digital value generated by modulator 152 into the feedback value 306. This may further include generating a signal 314 that represents the incremental change in the input signal 326.

System 10 integrates the incremental changes in the input signal at step 1106. This may include, for example, integrator 310 in modulator 152 receiving values 314 representing a plurality of incremental changes in the input signal 326. This may also include integrator 310 combining the values 314 and producing a signal 316 that represents the overall change in the input signal 326. System 10 quantizes the integrated incremental changes at step 1108. This may include, for example, quantizer 302 in modulator 152 comparing the signal 316 with a reference voltage, such as ground. If the signal 316 is higher than the reference voltage, a high digital output is generated in signal 328. If the signal 316 is lower than the reference voltage, a low digital output is generated in signal 328.

System 10 digitally filters the quantized signals at step 1110. This may include, for example, filter 54 counting the number of high and low values in signal 128 within a given time period. This may also include filter 54 generating a digital value in digital output signal 124 based on the number of high and low signals.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A system for sampling an input signal, comprising:

a plurality of analog-to-digital converters each operable to receive an input signal and to convert the input signal into a digital output signal, at least one of the plurality of analog-to-digital converters also operable to receive a bias voltage different than a bias voltage received by at least one other of the plurality of analog-to-digital converters, the at least one analog-to-digital converter and the at least one other analog-to-digital converter also operable to convert the input signal into the digital output signal by biasing the input signal with the bias voltage received by the respective converter, the plurality of analog-to-digital converters comprising first-order Delta-Sigma analog-to-digital converters; and a digital accumulator coupled to the plurality of analog-to-digital converters, the digital accumulator operable to receive the digital output signals from the plurality of analog-to-digital converters and to generate a net digital output signal comprising a sum of the digital output signals.

2. The system of claim 1, wherein at least one of the plurality of analog-to-digital converters comprises:

an anti-alias filter operable to filter the input signal;

a modulator coupled to the anti-alias filter and operable to receive the filtered input signal and the bias voltage, the modulator also operable to generate a digital signal using the bias voltage; and a digital filter coupled to the modulator and operable to filter the digital signal and generate the digital output signal.

3. The system of claim 1, wherein at least one of the plurality of analog-to-digital converters comprises:

an anti-alias filter operable to filter the input signal; and a modulator coupled to the anti-alias filter and operable to receive the filtered input signal and the bias voltage, the modulator also operable to generate the digital output signal using the bias voltage; and further comprising a digital filter coupled to the digital accumulator and operable to filter the net digital output signal.

4. The system of claim 1, wherein all of the plurality of analog-to-digital converters are operable to receive bias voltages.

5. The system of claim 1, wherein all of the plurality of analog-to-digital converters are operable to receive different bias voltages.

6. An antenna, comprising:

at least one receiver operable to receive an input signal;

a plurality of analog-to-digital converters coupled to the at least one receiver, the plurality of analog-to-digital converters each operable to receive the input signal from the receiver and to convert the input signal into a digital output signal, at least one of the plurality of analog-to-digital converters also operable to receive a bias voltage different than a bias voltage received by at least one other of the plurality of analog-to-digital converters, the at least one analog-to-digital converter and the at least one other analog-to-digital converter also operable to convert the input signal into the digital output signal by biasing the input signal with the bias voltage received by the respective converter, the plurality of analog-to-digital converters comprising first-order Delta-Sigma analog-to-digital converters; and a digital accumulator coupled to the analog-to-digital converters, the digital accumulator operable to receive the digital output signals from the plurality of analog-to-digital converters and to generate a net digital output signal comprising a sum of the digital output signals.

7. The antenna of claim 6, wherein at least one of the plurality of analog-to-digital converters comprises:

an anti-alias filter operable to filter the input signal;

a modulator coupled to the anti-alias filter and operable to receive the filtered input signal and the bias voltage, the modulator also operable to generate a digital signal using the bias voltage; and a digital filter coupled to the modulator and operable to filter the digital signal and generate the digital output signal.

8. The antenna of claim 6, wherein at least one of the plurality of analog-to-digital converters comprises:

an anti-alias filter operable to filter the input signal; and a modulator coupled to the anti-alias filter and operable to receive the filtered input signal and the bias voltage, the modulator also operable to generate the digital output signal using the bias voltage; and further comprising a digital filter coupled to the digital accumulator and operable to filter the net digital output signal.

9. The antenna of claim 6, wherein all of the plurality of analog-to-digital converters are operable to receive bias voltages.

10. The antenna of claim 6, wherein all of the plurality of analog-to-digital converters are operable to receive different bias voltages.

11. The antenna of claim 6, further comprising at least one amplifier coupled to the receiver, the amplifier operable to receive and amplify the input signal.

12. A method for sampling an input signal, comprising:

receiving an input signal at each of a plurality of analog-to-digital converters;

converting the input signal into a digital output signal at each of the plurality of analog-to-digital converters, at least one of the plurality of analog-to-digital converters operable to receive a bias voltage different than a bias voltage received by at least one other of the plurality of analog-to-digital converters, the at least one analog-to-digital converter and the at least one other analog-to-digital converter also operable to convert the input signal into the digital output signal by biasing the input signal with the bias voltage received by the respective converter, the plurality of analog-to-digital converters comprising first-order Delta-Sigma analog-to-digital converters; and generating a net digital output signal comprising a sum of the digital output signals.

13. The method of claim 12, wherein at least one of the plurality of analog-to-digital converters comprises:

an anti-alias filter operable to filter the input signal;

a modulator coupled to the anti-alias filter and operable to receive the filtered input signal and the bias voltage, the modulator also operable to generate a digital signal using the bias voltage; and a digital filter coupled to the modulator and operable to filter the digital signal and generate the digital output signal.

14. The method of claim 12, wherein at least one of the plurality of analog-to-digital converters comprises:

an anti-alias filter operable to filter the input signal; and a modulator coupled to the anti-alias filter and operable to receive the filtered input signal and the bias voltage, the modulator also operable to generate the digital output signal using the bias voltage; and further comprising filtering the net digital output signal.

15. The method of claim 12, further comprising biasing all of the plurality of analog-to-digital converters with bias voltages.

16. The method of claim 12, further comprising biasing all of the plurality of analog-to-digital converters with different bias voltages.

17. The method of claim 12, further comprising amplifying the input signal.

* * * * *